United States Patent [19]

Galen et al.

[11] 4,455,655

[45] Jun. 19, 1984

[54] REAL TIME FAULT TOLERANT ERROR CORRECTION MECHANISM

[75] Inventors: Peter M. Galen; Kent D. Wilken, both of Boise, Id.

[73] Assignee: Hewlett-Packard Company, Palo Alto, Calif.

[21] Appl. No.: 306,634

[22] Filed: Sep. 28, 1981

[51] Int. Cl.³ .................................................. G06F 11/10
[52] U.S. Cl. .................................................. 371/38
[58] Field of Search .................................. 371/38, 37

[56] References Cited

U.S. PATENT DOCUMENTS

| 3,825,893 | 7/1974 | Bossen et al. | 371/38 |
| 4,058,851 | 11/1977 | Scheuneman | 371/38 |
| 4,236,247 | 11/1980 | Sundberg | 371/38 |
| 4,249,253 | 2/1981 | Gentili et al. | 371/38 |
| 4,276,646 | 6/1981 | Haggard et al. | 371/37 |

Primary Examiner—Charles E. Atkinson
Attorney, Agent, or Firm—William H. MacAllister; F. David LaRiviere

[57] ABSTRACT

The present invention provides a real-time fault-tolerant hardware error correction device which is typically implemented as a data transfer circuit between a disc memory and a processing unit. It operates in two modes: as an encoding system and error detector on a disc write, and as a decoding system and error corrector on a disc read. In its first mode, each block of data from the processing unit is encoded with an error syndrome as it is transmitted to the disc memory. Two identical linear feedback shift registers (LFSR's) are used for error detection purposes. In its second mode, the same two LFSR's are implemented with a buffer memory to achieve real-time error correction. Data flow to the LFSR's from the disc memory is alternated block-by-block, one block being received by one LFSR and the succeeding block being received by the other LFSR. At the same time that data is channeled to a particular LFSR, it is channeled synchronously to the buffer memory. While one LFSR is decoding the incoming block, the other LFSR is providing output signals to correct the previous data block which is leaving the buffer memory as new incoming data arrives.

2 Claims, 5 Drawing Figures

REAL TIME FAULT TOLERANT ERROR CORRECTION MECHANISM

BACKGROUND OF THE INVENTION

This invention relates to a device for detecting and correcting hardware errors in the storage and recovery of data. More specifically, it relates to the design of an error correction system for real-time, fault-tolerant error detection and correction in a disc memory system.

Generally, error correction systems add redundant information in accordance with an error correction code, or ECC, to each data block which is written on a disc. This redundant information is then used to determine the integrity of the data block when it is read from the disc at a later time. The use of an ECC makes it possible to detect, locate, and correct errors in a data block provided that the extent of the error is within the capabilities of the particular ECC. Many such systems have been developed in the prior art. See, for example, "Burst-Correcting Codes with High-Speed Decoding" by R. T. Chien in IEEE Trans. On Information Theory, Vol. IT-15, No. 1, pp. 109–112, January 1969, and Error-Correcting Codes, 2nd Ed., W. W. Peterson and E. J. Weldon, MIT Press 1972.

In some error correction schemes, the computer's central processing unit (CPU) or a separate microprocessor is used to correct errors. In either case, detection of an error interrupts real time data flow as the processor corrects the error. Furthermore, although the time required to make the correction may be of short duration, the processor gets out of synchronism with the data, causing a halt in data flow until the disc makes a complete revolution and arrives again at the next data block. This results in a considerable delay before data flow can be re-established.

Another solution to the problem of interrupting the flow of data to the CPU involves implementing a microprocessor outside of the CPU and providing sufficient memory to retain several blocks of data. Typically, a linear feedback shift register (LFSR) is used to calculate an "error syndrome", i.e., the numerical result of the ECC, as a data block is read from the disc into a first buffer memory. Once an error syndrome is calculated, it is then passed to the microprocessor which determines the error pattern and error location and does the correction in local memory. While the microprocessor is correcting errors in this particular data block, a second data block is entering a second buffer memory and the LFSR is calculating its syndrome. Finally, the original data block in the first buffer is corrected by the microprocessor, and the corrected data is sent to an output buffer and then to the CPU. During this latter stage, the syndrome for a third data block is being calculated by the LFSR and corrections based on the syndrome for the second data block are being implemented in the microprocessor. In this way, the CPU receives an uninterrupted stream of data.

A significant problem with this solution is the hardware complexity and the associated costs of implementing such a combination of buffer memory, microprocessor, concomitant timing and control circuits, and interface elements. In addition, there is still a significant "pipeline" delay as the initial block of data is shifted serially through as many as three data blocks of memory.

Another major problem with existing error correction systems is assuring the fault tolerance of the error correction system as it encodes data written on the disc. A failed ECC encoding circuit can potentially corrupt the entire storage area. Hence, the time required to discover the error is unbounded, since an encoding fault may not be discovered until the data is decoded. In a typical system, backup data is only available if the disc can immediately notify the system that an encoding failure has occurred before an alternate copy of the data is destroyed. This type of fault tolerance problem is typically overcome by double or triple redundancy in the encoding hardware. The obvious disadvantage in this situation is added complexity and cost.

Heretofore, no simple, inexpensive solution to the problem of real-time fault-tolerant error correction has been developed. Furthermore, prior implementations of circuits used for both decoding and redundant encoding have not made optimum use of all available hardware.

The present invention provides a real-time fault-tolerant hardware error correction device with a degree of simplicity which allows its fabrication in a single integrated circuit. This device, hereinafter referred to as an ECC module, is designed to improve the integrity and recoverability of data written on a disc memory system and requires minimal hardware.

In operation, the ECC module is typically implemented as a data transfer circuit between a disc memory and a processing unit, although the principles of the invention are fully transferable to numerous other situations involving the transfer of digital information between two transmitter/receivers. In its first mode, which is associated with a disc write, the ECC module operates as an encoder by calculating an error syndrome for each block of data transmitted from the processing unit, and by interjecting this redundant information into the data stream at the end of each block, as each block is transmitted to the disc memory. Error detection is provided in this encoding process by using two electrically identical linear feedback shift registers (LFSR's). As both LFSR's are calculating an error syndrome for each data block, their respective outputs are compared to see if an error has occurred.

In its second mode, the ECC module operates as a decoder and error corrector on a disc read. The same two LFSR's used in the encoding process are used in this mode to determine the error pattern and error location, and to provide output signals to be used in correcting data from the disc memory. Real-time error correction is accomplished with only minimal pipeline delay by alternating the data flow from the disc memory, block by block, one block being received by one LSFR and the succeeding block being received by the other LFSR, i.e., each LFSR receives only every other block of data. At the same time data is channeled to a particular LFSR, it is channeled synchronously to a buffer memory which is one data block long. While one LFSR is decoding the incoming data block, the other LFSR is providing output signals to correct the previous data block which is leaving the buffer memory as a new incoming data block arrives.

Implemented in the above fashion, the present invention presents a minimal hardware solution to real-time fault-tolerant error detection and correction. By utilizing the same two LFSR's for both encoding and decoding, the ECC module is far less complex than the devices in the prior art and still provides a significant measure of redundancy in the encoding process. Further, the disclosed technique requires only one data block of buffer memory as compared to as many as three data blocks of buffer memory in other current solutions, thereby significantly reducing the problem of pipeline delay associated with shifting data serially through multiple buffers.

DETAILED DESCRIPTION OF THE INVENTION

Figure 1:
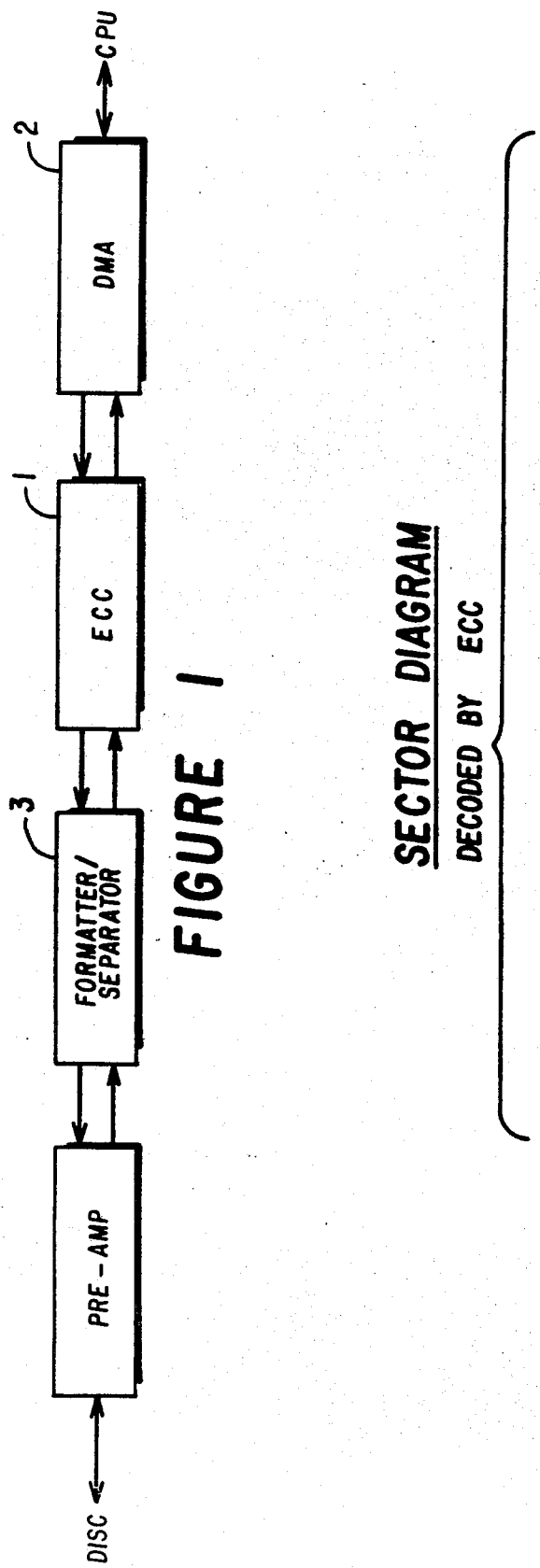
FIG. 1 shows a typical implementation of an error correction code module in a disc drive.
Figure 3:
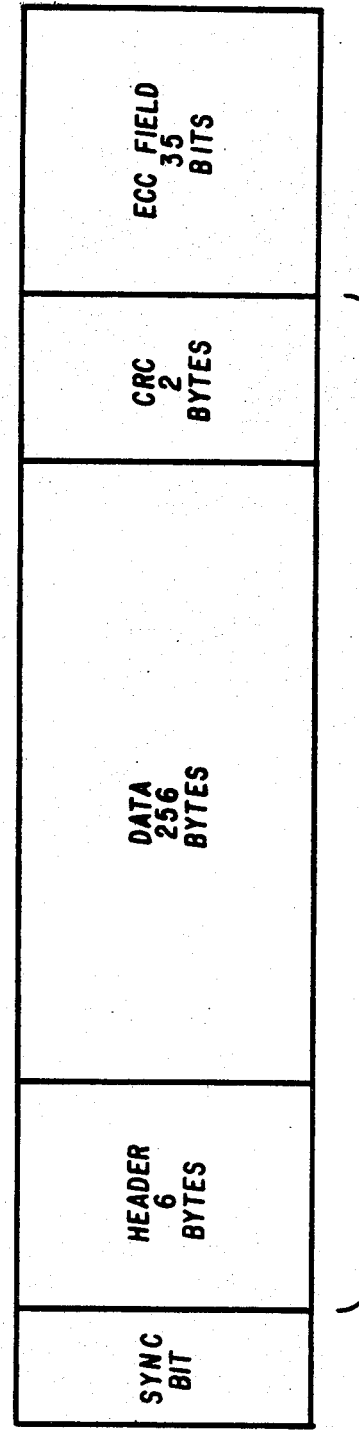
FIG. 3 shows the field locations in a typical sector of data in a disc memory system which uses the subject invention.
Figure 2:
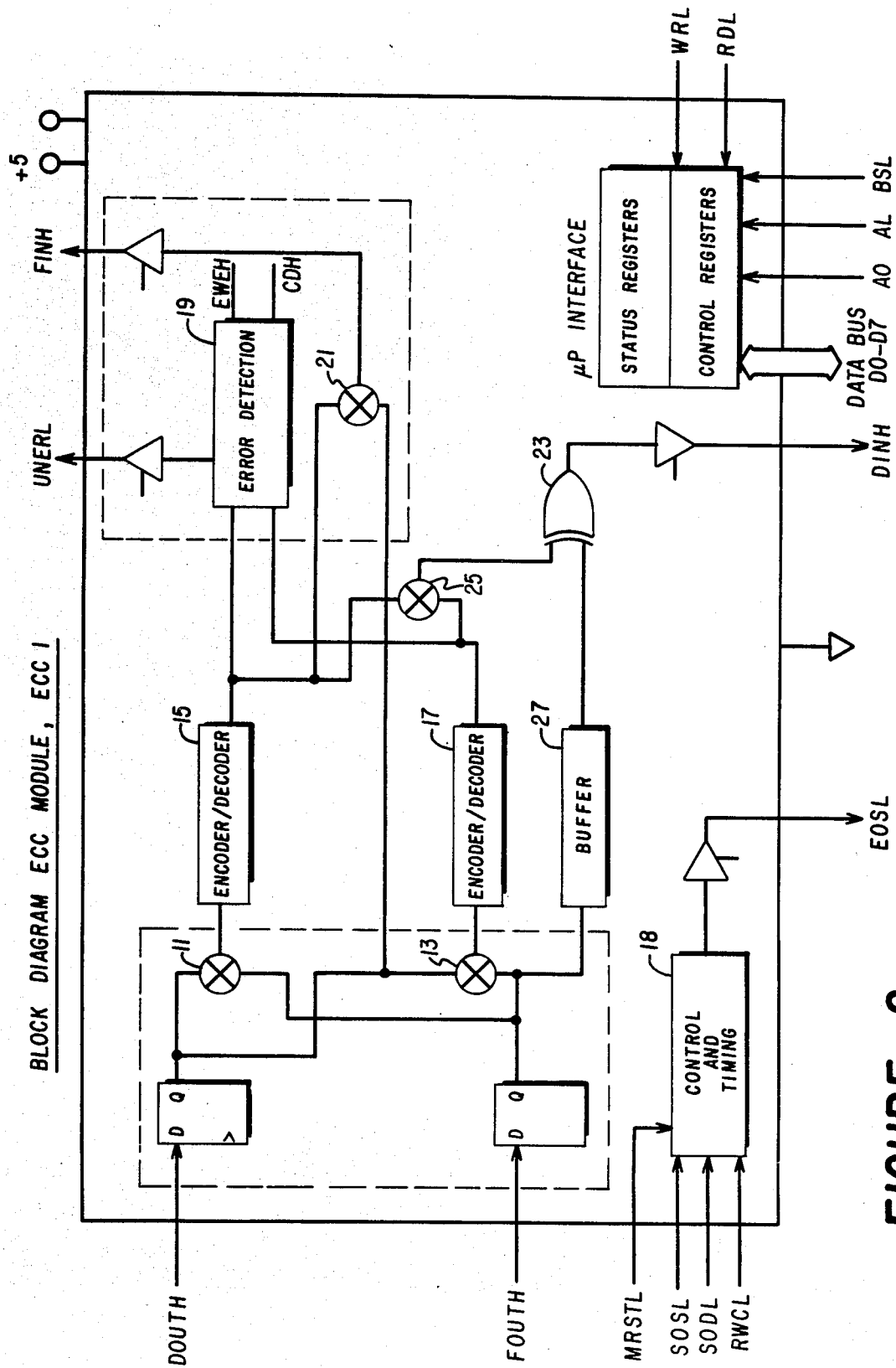
FIG. 2 is a block diagram of the error correction code module showing the relationship among its various components.

Illustrated in FIGS. 1 and 2 is a typical implementation of the invention. In this configuration, an error correction code module, ECC 1, is located between a disc memory access, DMA 2, and a formatter/separator 3. During a disc write, output data from DMA 2 (indicated by DOUTH) enters ECC 1 and is channeled via multiplexers 11 and 13 to a first encoder/decoder 15 and a second encoder/decoder 17 in response to a control system 18. Both encoder/decoder 15 and 17 calculate an error syndrome for each block of incoming data, and their respective outputs are compared in an error detector 19. Output signals to formatter/separator 3 (indicated by FINH) are encoded by means of a multiplexer 21, by time division multiplexing the output signal of encoder/decoder 15, block by block, with the original data from DMA 2. Typically in this mode, the data from DMA 2 is passed to the formatter/separator until the end of the data field. At that point the redundant information, i.e., the syndrome for that block, is added by ECC 1. FIG. 3 shows a typical data block of 264 bytes from the DMA, and the location of a 35 bit field for the syndrome which is provided by encoder/decoder 15. Together, the ECC field and data block field make up a combined data block of 2147 bits, which corresponds to one full sector on the disc.

Encoder/decoder 15 and encoder/decoder 17 may comprise two, 35-stage linear feedback shift registers. The internal feedback paths for both encoder/decoder 15 and encoder/decoder 17 were chosen to correspond to a 35 bit Fire code represented by a generator polynomial:

$$(X^{23}+1)*(X^{12}+X^{10}+X^9+X^7+X^6+X^4+1).$$

Figure 4:
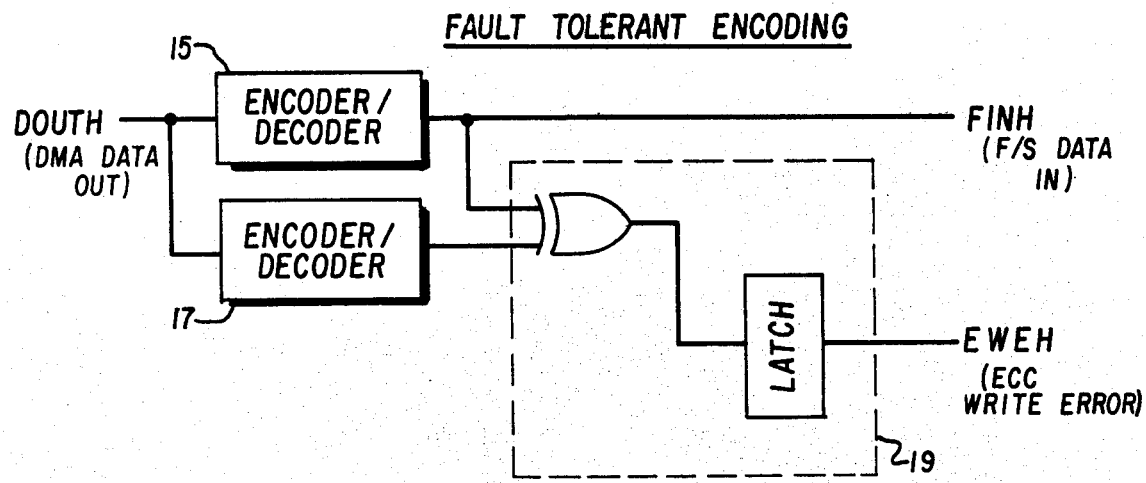
FIG. 4 is a block diagram showing the relationship of the various components of the invention during a disc write.

Hence, encoder/decoder 15 and encoder/decoder 17 are electrically identical in the sense that their respective outputs should be the same for a common input, with the exception of the occurrence of hardware errors. To detect such an occurrence of hardware errors, error detector 19 is provided to compare the respective outputs of the two encoder/decoders and to set a flag, EWEH, if the outputs disagree. FIG. 4 provides a block diagram showing the relationship of error detector 19 to the other elements in ECC 1 on a disc write and the data paths corresponding to this type of fault-tolerant encoding.

Figure 5:
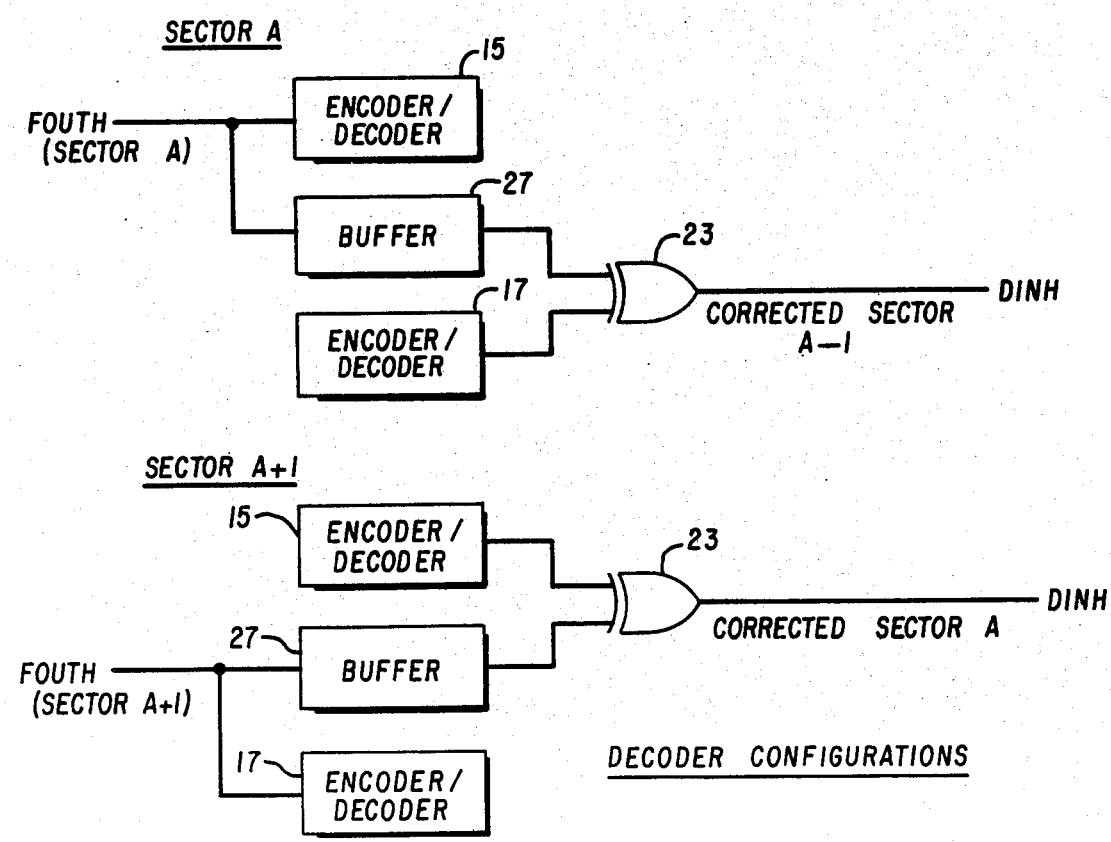
FIG. 5 is a block diagram showing the relationship of the various components of the invention during a disc read.

Another important feature of the invention is to provide real-time error detection and correction on a disc read. Again referring to FIG. 2, data enters ECC 1 from formatter/separator 3 through FOUTH. Multiplexers 11 and 13 distribute the incoming data, sector by sector, in an alternating manner to encoder/decoder 15 and to encoder/decoder 17 in response to signals from control system 18. Operating synchronously with each encoder/decoder is a buffer memory 27, which is functionally a shift register designed to hold one full sector. As data from one sector is shifted into buffer memory 27, data from the previous sector is shifted out to the DMA via an Exclusive-OR gate 23. At the start of each sector, the function of each encoder/decoder is switched in response to control system 18, so that while one encoder/decoder is decoding the incoming data, the other encoder/decoder is attempting to locate errors in the outgoing data and supplying correction signals at Exclusive-OR 23 to correct data being output from buffer memory 27. Multiplexer 25 is used to alternate the outputs from the two encoder/decoders to Exclusive-OR 23. This complete process is depicted in FIG. 5. As one sector, for example Sector A, is being input to encoder/decoder 15 and buffer memory 27, the preceeding sector, Sector A−1, is being corrected by signals from encoder/decoder 17 at Exclusive-OR 23 as it is output from buffer memory 27. Similarly, as Sector A is being corrected, the following sector, Sector A+1, is entering buffer memory 27 and encoder/decoder 17.

In each encoder/decoder, the same linear feedback shift register (LFSR) is used for both encoding, and decoding with error correction. In this latter mode, data is input simultaneously to a particular encoder/decoder and the buffer memory. To adjust the data length specified by the generator polynomial and the actual sector length, the data is pre-shifted. As the data enters, it undergoes a polynomial divide on each clock cycle. At the completion of the ECC field, the particular LFSR should be all zero's if no error has occurred, i.e., the remainder from the polynomial divide is zero. If the LFSR is non-zero, a correctable or uncorrectable error has occurred. The encoder/decoder is then shifted once each clock cycle with no input, again undergoing a polynomial divide, while the buffer memory is shifted out once each clock cycle. In this particular implementation, as soon as all zeros appear in the first 23 stages of the LFSR, an error pattern, if an error exists, will be located in the last 12 stages, and therefore will be in a position to leave the buffer memory on the next 12 clock cycles. (With the chosen generator polynomial, the maximum burst error length that can be trapped is 12.) The output data to DINH is then corrected, bit by bit at Exclusive-OR 23, by inverting those bits from the buffer memory that align with the error pattern found during decoding. If any bit is corrected, the ECC records that as a correctable error and error detector 19 sets a flag, CDH, which is held for one sector. If no bits are corrected during a sector and the LFSR is not all zeros, then error detector 19 sets a flag, UNERL, indicating an uncorrectable error. Although there is a possibility that an uncorrectable error will be incorrectly flagged as a correctable error and correction attempted, a cyclic redundancy check (CRC) which resides in the DMA provides protection against this occurrence.

In conclusion, the present invention provides a simple inexpensive solution to the problem of real-time, fault-tolerant encoding and decoding of digital signals. This solution is accomplished with a minimum of hardware elements by using in combination, the same two linear feedback shift registers in the encode mode that are used in the decode mode. This combination makes possible realtime error correction with only minimal pipeline delay, and at the same time provides an important measure of redundancy in the encoding process.

While the invention has been illustrated and described with respect to a particular embodiment, the principles of the invention are fully adaptable to many other situations requiring fault-tolerant error-correction systems. It will be understood by those skilled in the art that many changes in form and details may be made without departing from the spirit and scope of the invention, particularly as it relates to other kinds of transmitter/receiver systems, different error correcting codes, and other specific circuital implementations for each of the essential elements shown in FIG. 2.

We claim:

1. An error-correcting code device for transmitting and correcting digital signals between a processing unit and a memory storage device comprising:

control means coupled with said memory storage device for providing first and second sets of control signals associated with successions of blocks of digital signals emanating from said memory storage device;

gating means having a plurality of channels and responsive to said first set of control signals for receiving a succession of blocks of digital signals from said memory storage device, for transmitting said succession of blocks of digital signals into a first channel, and for transmitting synchronously with transmissions into said first channel, block by block, said succession of blocks of digital signals into a second and third channel in an alternating manner;

a buffer memory, coupled to said gating means through said first channel, for receiving said succession of blocks of digital signals and for transmitting said succession of blocks of digital signals so received, one block after another;

first encoder/decoder means for receiving blocks of digital signals from said second channel, and in response to said first set of control signals for both performing error processing on each block and providing alternate blocks of output signals in synchronism in corresponding blocks of digital signals transmitted from said buffer memory, each alternate block of output signals containing an error correcting pattern;

second encoder/decoder means, electrically identical to said first encoder/decoder means, for receiving blocks of digital signals from said third channel, and in response to said first set of control signals for both performing error processing on each block and providing alternate blocks of output signals in synchronism with corresponding blocks of digital signals transmitted from said buffer memory, each alternate block of output signals containing an error correcting pattern;

correction means, coupled to said first and second encoder/decoder means and to said buffer memory, responsive to said first set of control signals, for receiving: said alternate blocks of output signals from said first encoder/decoder means, said alternate blocks of output signals from said second encoder/decoder means, and said succession of blocks of digital signals from said buffer memory;

said gating means also being responsive to said second set of control signals for receiving a succession of blocks of digital signals from said processing unit and for transmitting said succession of blocks of digital signals simultaneously into said second channel, into said third channel, and into a fourth channel;

said first encoder/decoder means, in response to said second set of control signals, developing a first error syndrome and providing a first set of output characters representing said first error syndrome for each block of digital signals received through said second channel;

said second encoder/decoder means, in response to said second set of control signals, developing a second error syndrome and for providing a second set of output characters representing said second error syndrome for each block of digital signals received through said third channels;

said error detection means, being responsive to said second set of control signals for receiving blocks of digital signals from said second, third and fourth channels, combining said blocks of digital signals from said fourth channel and said output blocks of digital signals from said first encoder/decoder means, providing a succession of encoded blocks of digital signals corresponding to said blocks of digital signals emanating from said processing unit, comparing said first and second sets of output characters developed for each block of digital signals received on said second and third channels, and providing an error flag when said first and second sets of output characters are not identical;

said correction means correcting each block in said succession of blocks of digital signals received from said buffer memory according to said error correcting pattern in each corresponding block of output signals from said first encoder/decoder means and from said second encoder/decode means.

2. A device as in claim 1 wherein:

said first encoder/decoder further comprises a linear feedback shift register; and said second encoder/decoder further comprises a linear feedback shift register.

* * * * *